United States Patent [19]
Nagaune

[11] Patent Number: 5,539,253
[45] Date of Patent: Jul. 23, 1996

[54] RESIN-SEALED SEMICONDUCTOR DEVICE

[75] Inventor: Fumio Nagaune, Kawasaki, Japan

[73] Assignee: Fuji Electric Co., Ltd., Kanagawa, Japan

[21] Appl. No.: 309,016

[22] Filed: Sep. 20, 1994

[30] Foreign Application Priority Data

Sep. 21, 1993 [JP] Japan .................................. 4-233975

[51] Int. Cl.⁶ .......................... H01L 23/22; H01L 23/24
[52] U.S. Cl. ...................... 257/687; 257/714; 257/706; 257/717; 361/704; 361/714
[58] Field of Search ..................................... 257/687, 704, 257/706, 707, 717; 361/704, 714

[56] References Cited

U.S. PATENT DOCUMENTS

| | | | |
|---|---|---|---|
| 4,788,626 | 11/1988 | Neidig et al. | 257/687 |
| 4,916,502 | 4/1990 | Oshima | 257/706 |
| 4,920,405 | 4/1990 | Itoh et al. | 257/687 |
| 5,172,215 | 12/1992 | Kobayashi et al. | 257/687 |

FOREIGN PATENT DOCUMENTS

| | | |
|---|---|---|
| 3309679 | 2/1984 | Germany . |
| 60-103649 | 6/1985 | Japan . |
| 63-304755 | 2/1988 | Japan . |
| 3-18047 | 1/1991 | Japan . |

Primary Examiner—Rolf Hille
Assistant Examiner—David Ostrowski
Attorney, Agent, or Firm—Spencer & Frank

[57] ABSTRACT

A resin-sealed semiconductor device includes a heat sink on which a semiconductor chip is provided. An output terminal is connected to the semiconductor chip. A casing surrounds the chip and part of the output terminal. The inside of the casing is filled with a sealing resin containing an aggregate such as glass particle. The chip is mounted in the area of an upper surface of the heat sink and the remaining area is covered with an epoxy resin film, which is from 10 μm to 20 μm thick. The resin film increases the bonding strength between the sealing resin and the heat sink and prevents the sealing resin from peeling away from the heat sink upon heat cycles due to different expansion coefficients.

12 Claims, 5 Drawing Sheets

5,539,253

RESIN-SEALED SEMICONDUCTOR DEVICE

BACKGROUND OF THE INVENTION

1. Field of the Invention

The present invention relates to a resin-sealed semiconductor device such as a diode, a thyristor, a transistor module, etc.

1. Description of Related Art

FIGS. 1 to 3 show a conventional resin-sealed semiconductor device. More specifically, FIG. 1 is a cross-sectional view of a conventional resin-sealed semiconductor device. FIG. 2 is a perspective view showing the conventional resin-sealed semiconductor device shown in FIG. 1. FIG. 3 is an enlarged partial, cross-sectional view showing the conventional resin-sealed semiconductor device shown in FIG. 1. In FIG. 1, 20 is a metal heat sink, 22 is a casing made of a resin and connected to the heat sink 20 with an adhesive. On the heat sink 20, there are provided two insulators 24, each of which has metalized surfaces, and conductor layers or patterns 26 formed on the metalized insulators, respectively, so that there are two "islands" each consisting of the insulator 24 and the conductor layer 26 superimposed one on another. A semiconductor chip 28 is mounted on each island. That is, the semiconductor chips 28 are mounted, via the insulators 24 and the conductor layers 26, on the heat sink 20 side by side at a certain distance from each other. The chips 28 are welded to the conductor layer 26. An upper electrode 30 is connected to each of the semiconductor chips 28, and an output terminal 31 is connected to the conductor layers 26. The upper electrodes 30 and the output terminal 31 extend outward through holes provided in an upper wall 22A of the casing 22. A sealing resin 32, such as an epoxy resin that contains an aggregate 34 such as quartz particles, fills an inner cavity defined by the casing 22. The aggregate 34 is added to the sealing resin 32 in order to reduce its amount as well as to increase its strength after its hardening.

In a resin-sealed semiconductor device having such a structure as described above, the sealing resin 32 tends to peel off from the heat sink 20 to form a gap therebetween. The gap formation causes various troubles and defects.

More particularly, as shown in FIG. 2, an increase in the temperature of the semiconductor device when it is heated, for example, in a heat cycle test will bring about a displacement of the heat sink 20, which generally has a thickness of about 3 mm, the displacement being in the direction indicated by an arrow P in an X–Y plane defined in an imaginary X–Y–Z space. On the other hand, the sealing resin 32 filled in the cavity in the casing 22 has a coefficient of thermal expansion different from that of the metal heat sink 20, and is displaced in the direction indicated by an arrow Q in the space X–Y–Z. Therefore, there arises a tensile force between the sealing resin 32 and the heat sink 20 due to a relative displacement therebetween. Since the sealing resin 32 contains a multiplicity of particles of the aggregate 34, such as glass particles, some of the particles of the aggregate directly contact the surface of the heat sink 20 to restrict or reduce the effective contact area in which the sealing resin itself contacts the surface of the heat sink 20. As a result, the bond strength between the resin and the heat sink decreases. Due to this as well as to the above-described difference in the coefficient of thermal expansion and relative displacement between the resin and the heat sink 20, peels tend to occur readily on an interface between the heat sink 20 and the sealing resin 32 filled in the cavity or space of the casing 22. In accordance with the peeling between the resin and the heat sink, there also occurs peeling on the surface of a marginal portion 20A of the heat sink 20 on which an end portion 22B (FIG. 3) of the casing 22 bonds.

FIG. 3 illustrates the state in which such a marginal peel has occurred. In FIG. 3, the symbol "g" indicates a gap formed between the heat sink 20 and the casing 22 or the sealing resin 32. In case there is a gap between the heat sink 20 and the end portion of the casing 22, moisture in the air outside penetrates into the sealing resin 32 through the gap g to deteriorate its moisture resistance. In addition, if there is a gap between the heat sink 20 and the sealing resin 32, a large stress is exerted to the semiconductor chips 28 welded to the respective conductor layers 26. As a result, cracks occur in the semiconductor chips. This is a major cause for the deterioration of not only reliability of the device but also good product rate.

SUMMARY OF THE INVENTION

Therefore, an object of the present invention is to solve the above-described defects of the conventional resin-sealed semiconductor device and provides a highly reliable resin-sealed semiconductor device having an improved bond strength between the heat sink and the sealing resin so that the occurrence of peeling on the interface therebetween can be prevented.

According to one aspect of the present invention, there is provided a semiconductor device comprising:

a heat sink;

a semiconductor chip provided on the heat sink;

an output terminal connected to the semiconductor chip;

a casing connected to an outer periphery of an upper surface of the heat sink, the casing together with the heat sink defining a space and surrounding the semiconductor chip and a part of the output terminal;

a sealing resin which fills the space defined by the heat sink and the casing, the resin sealing the semiconductor chip; and a resin film provided on an upper surface of the heat sink, at least a part of the resin film contacting the sealing resin directly.

Here, the resin film may be an epoxy resin film.

The resin film may have a thickness of from 10 μm to 20 μm.

The resin film may cover an area of the upper surface of the heat sink other than an area where the semiconductor chip is to be mounted.

The resin film may cover all over the upper surface of the heat sink, and the semiconductor device may further comprise a conductor layer, the semiconductor chip being provided on the conductor layer.

The resin-sealed semiconductor may further comprise an insert provided between the heat sink and the semiconductor chip for increasing contact engagement with the sealing resin.

The insert may have a bottom portion and a side wall portion connected to the bottom portion, the bottom portion may be fixed to the heat sink and the side wall portion may contact the sealing resin.

The side wall portion may be provided with a through hole filled with the sealing resin.

The sealing resin may contain an aggregate.

The resin-sealed semiconductor device may further comprise an anchoring member intervening between the heat sink and the semiconductor chip, the anchoring member reinforcing the engagement between the anchoring member and the sealing resin.

According to another aspect of the present invention, there is provided a resin-sealed semiconductor device comprising:

a heat sink;

a resin film formed on an upper surface of the heat sink;

a conductor layer provided on the resin film;

a semiconductor chip provided on the conductor layer;

an output terminal connected to the semiconductor chip;

a casing connected to an outer periphery of the upper surface of the heat sink, the casing together with the heat sink defining a space and surrounding the semiconductor chip and a part of the output terminal;

a sealing resin which fills the space defined by the heat sink and the casing, the resin sealing the semiconductor chip; and a reinforcing means for reinforcing connection between the heat sink and the sealing resin, the reinforcing means being inserted between the conductor layer and the semiconductor chip.

The reinforcing means may comprise a metal base.

The metal base may have a bottom portion and a side wall portion connected to the bottom portion, the bottom portion being fixed to the heat sink and the side wall portion contacting the sealing resin.

The side wall portion may be provided with a through hole filled with the sealing resin.

The resin film may be an epoxy resin film.

The resin film may have a thickness of from 10 μm to 20 μm.

The sealing resin may contain an aggregate.

As described above, when a resin film having a good adhesion with metals, such as an epoxy resin film, is provided on the upper surface of a heat sink, a sealing resin filled in the space in the casing in a subsequent step bonds well to the resin film since the material resembles each other. In addition, the aggregate contained in the sealing resin do not contact the upper surface of the heat sink in the interface between the upper surface of the heat sink and the sealing resin. Therefore, the provision of the resin film increases the bond strength of the sealing resin to the heat sink. This prevents the occurrence of peeling between the sealing resin and the heat sink and also prevents the occurrence of cracks in semiconductor chips when the semiconductor device itself undergoes thermal hysteresis.

Further, provision of the insert between the heat sink and the semiconductor chip improves bonding between the heat sink and the sealing resin after the sealing resin is filled in the space and cured since more contact or engagement with the sealing resin can be attained.

The above and other objects, effects, features and advantages of the present invention will become more apparent from the following description of embodiments thereof taken in conjunction with the accompanying drawings.

DETAILED DESCRIPTION OF THE INVENTION

The heat sink 20 may be made of any metal or alloys thereof that are commonly used in the art for this purpose, such as copper, aluminum, brass, etc. Of these, copper is preferred since it has a good heat releasing property or good heat conductivity.

The casing may be made of a resin such as an epoxy resin.

The sealing resin may be an epoxy resin.

The aggregate which can be mixed with the sealing resin includes hard glass particles such as glass particles and quartz particles.

The resin which can be used as the resin film to be provided on the upper surface of the heat sink includes those resins that have good adhesiveness with the metal constituting the heat sink as well as with the sealing resin. An epoxy resin, which has a good adhesiveness with metals, can be used advantageously for forming the resin film to be provided between the heat sink and the sealing resin.

Preferably, the resin film may be from 10 μm to 20 μm thick.

Generally, it is preferred that the resin film have an expansion coefficient between the expansion coefficient of the sealing resin and the expansion coefficient of the metal of the heat sink. More preferably, the resin film has a linear expansion coefficient on the order of $10^{-6}$ to $10^{-5}$ although it may vary to some extent depending on exact combinations of the metal of the heat sink and the sealing resin.

The insert has a portion that is inserted and fixed between the heat sink and the semiconductor chip 26 and another portion or engaging portion that contacts or engages with the sealing resin. A typical example of the insert is made of a metal plate which includes a bottom plate and side walls. The bottom plate is fixed on one surface thereof to the upper surface of the heat sink and on the opposite surface to the semiconductor chip, for example, by welding. In order to further increase engagement between the insert and the sealing resin, it is preferred that side walls be provided with through holes in which the sealing resin is to be filled. Typically, the through holes may be circular. However they may be in any other form such as slots that allow the sealing resin to readily come thereinto and have increased engagement after curing.

EMBODIMENTS

Figure 2:
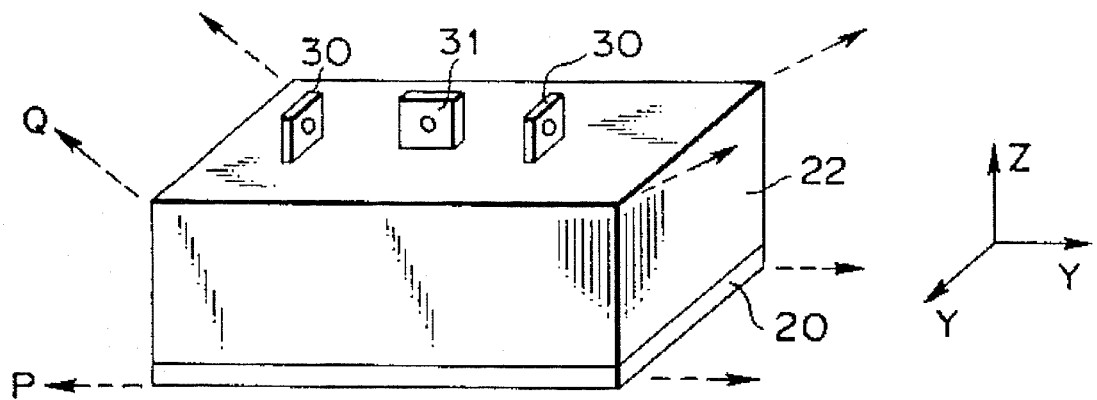
FIG. 2 is a perspective view showing the resin-sealed semiconductor device shown in FIG. 1, illustrating the direction of displacement of each portion due to thermal expansion upon temperature elevation.
Figure 3:
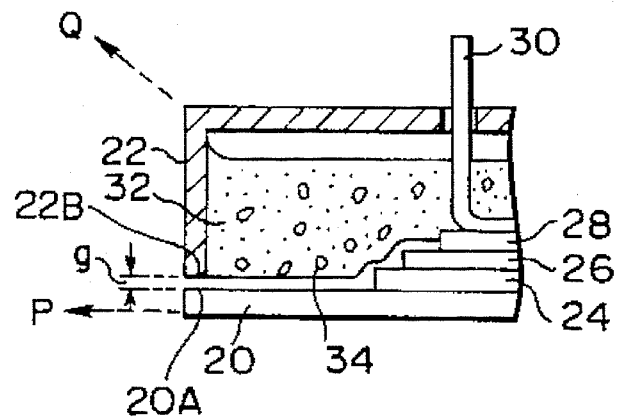
FIG. 3 is a partial enlarged cross-sectional view showing the conventional resin-sealed semiconductor device shown in FIG. 1, illustrating a defective state in which the sealing resin has peeled-off from the heat sink.

Hereinafter, the present invention will be described in detail with reference to the attached drawings. In the following embodiments, the same or like members or parts are indicated by the same reference numerals as used in FIGS. 1 to 3.

EMBODIMENT 1

Figure 1:
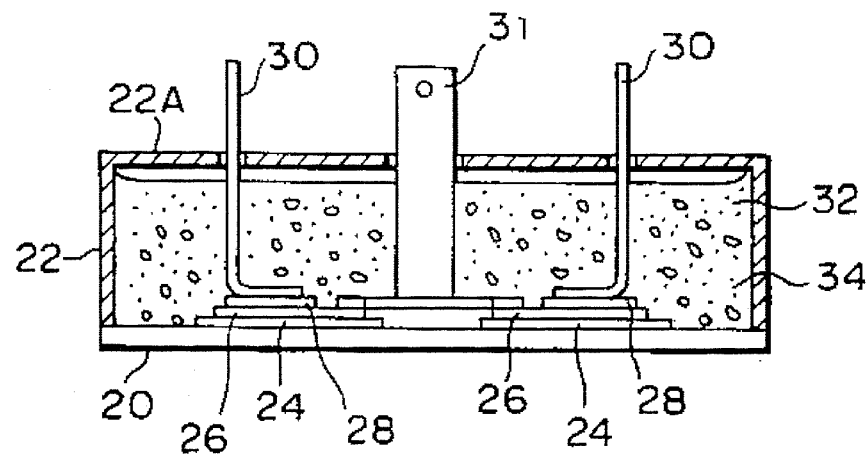
FIG. 1 is a schematic vertical cross-sectional view showing a conventional resin-sealed semiconductor device.
Figure 4:
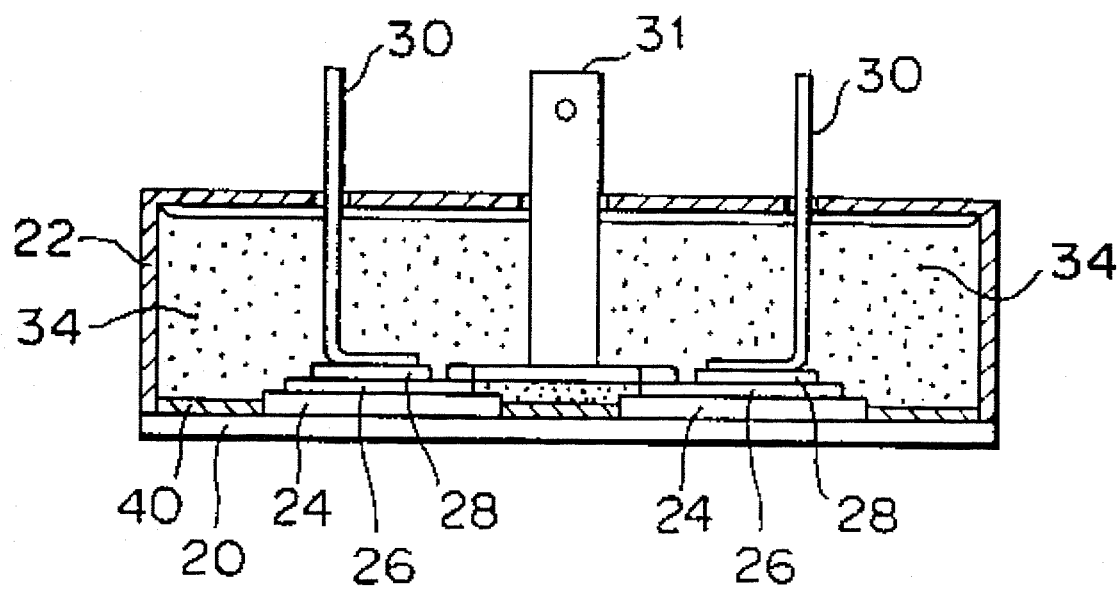
FIG. 4 is a vertical cross-sectional view showing a resin-sealed semiconductor device in accordance with Embodiment 1 of the present invention.
Figure 5:
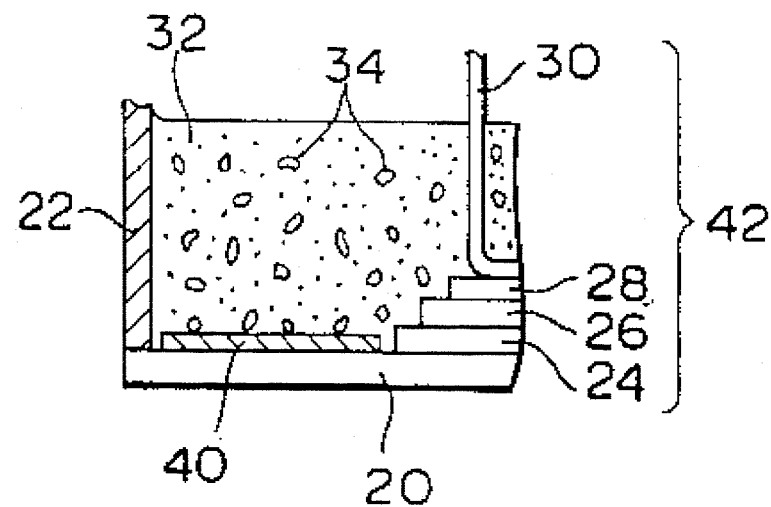
FIG. 5 is a partial enlarged view showing the resin-sealed semiconductor device of the present invention shown in FIG. 4.

In FIGS. 4 to 7, the semiconductor device has basically the same structure as that shown in FIG. 1. That is, the semiconductor device of the present invention includes a heat sink 20 made of copper 3 mm thick. A casing 22 made of an epoxy resin is bonded with an adhesive to an upper surface 21 (cf. FIG. 7) of the heat sink 20 in its outer peripheral area. On the upper surface 21 of the heat sink 20, there are mounted two insulators 24 made of a ceramic, on each of which a conductor layer or pattern 26 is mounted. Both surfaces of each insulator 24 are metalized and fixed to the upper surface 21 of the heat sink 20 and to the conductor layer 26, respectively. The conductor layers 26 have each a conductor pattern necessary for the function of the semiconductor device. Each conductor layer 26 has mounted thereon a semiconductor chip 28. The semiconductor chips 28 are fixed as by welding to the respective conductor layers 26. In the present embodiment, two semiconductor chips 28 are respectively mounted on the heat sink 20 through the insulator 24 and the conductor layer 26 as shown in FIG. 4. Thus, there formed two "islands" that have mounted the semiconductor chips, respectively. The semiconductor chips 28, or more specifically, upper electrodes thereof (not shown), are connected to output terminals 30, respectively. The two conductor layers 26 are connected to each other by means of an output terminal 31. The other ends of the output terminals extend outside through the casing 22.

Figure 6:
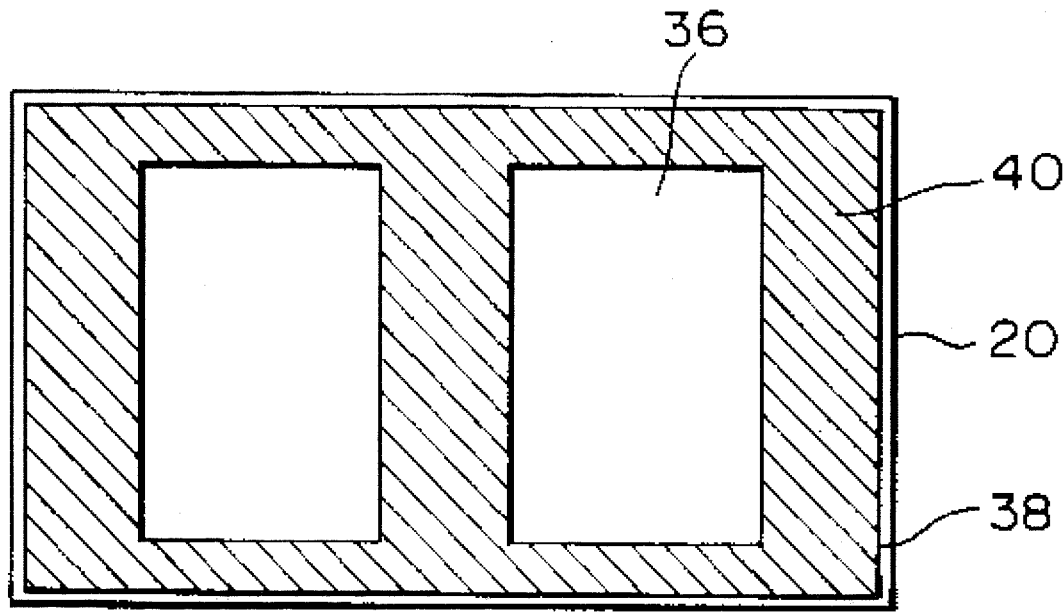
FIG. 6 is a plan view showing the resin-sealed semiconductor device of the present invention shown in FIG. 4.
Figure 7:
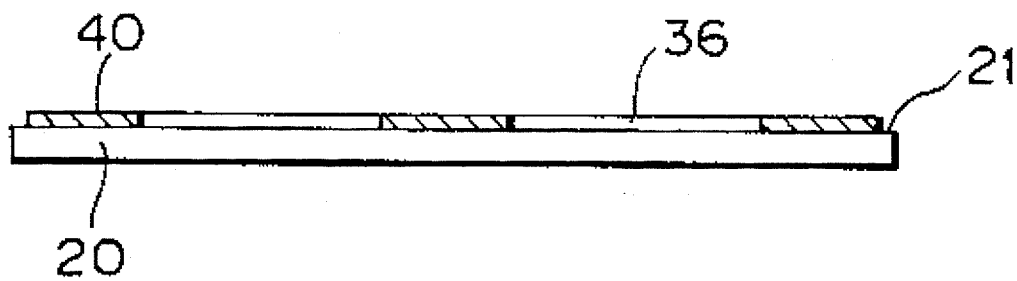
FIG. 7 is a side elevation showing the heat sink used in the resin-sealed semiconductor device shown in FIG. 1.
Figure 8:
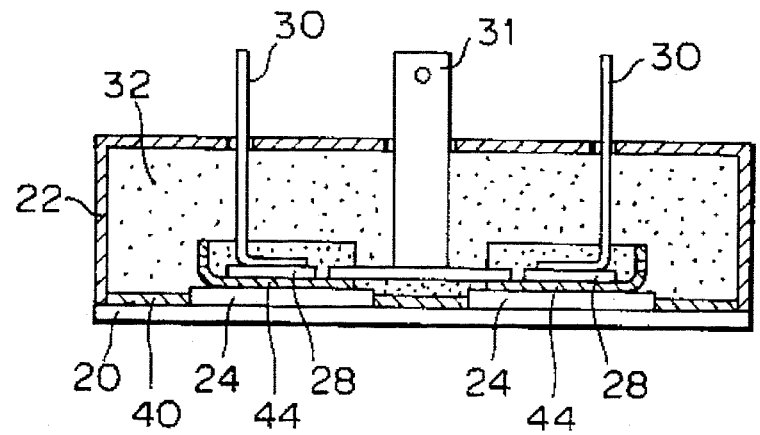
FIG. 8 is a vertical cross-sectional view showing a resin-sealed semiconductor device in accordance with Embodiment 2 of the present invention.
Figure 9:
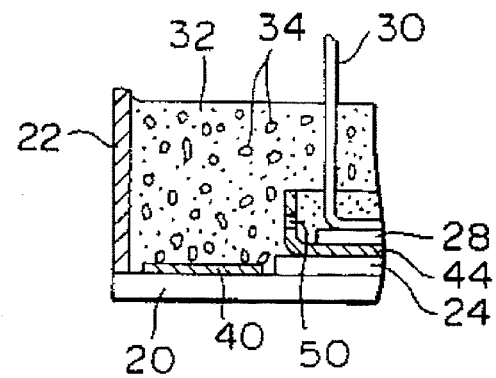
FIG. 9 is a partial enlarged view showing the resin-sealed semiconductor device shown in FIG. 8.

As shown in FIG. 6, the upper surface 21 of the heat sink 20 includes areas 36 positioned side by side at a distance. The insulators 24 are arranged in the areas 36, respectively. In other words, the areas 36 are mounting areas for mounting the semiconductor chips 28. A resin film 40 is provided on a part of the supper surface 21 of the heat sink 20, i.e., a remaining area other than the outer peripheral portion 38 where the end portion of the casing 22 bonds to the heat sink 20 as well as the mounting area 36 (i.e., the hatched area in FIG. 6). The resin film 40 is made of an epoxy resin, which has good adhesion properties with metals. The resin film is formed by coating a solution of an epoxy resin known in the art to a thickness of, e.g., from 10 μm to 20 μm (dry basis) on the available part of the upper surface 21 of the heat sink 20. Within the space defined by the upper surface 21 of the heat sink 20 and the casing 22, there is filled a sealing resin 32 comprising an epoxy resin which contains glass powder or quartz particles as an aggregate 34.

When assembling a semiconductor device, two assemblies 42, each having the insulator 24, the conductor layer 26, the semiconductor chip 28, and the output terminal 30, are positioned on the mounting areas 36, respectively, of the upper surface 21 of the heat sink 20 which has already been covered with the resin film 40. Then, the casing 22 is placed on the heat sink 20 and bonded thereto with an adhesive. Thereafter, the sealing resin 32 which contains the aggregate 34 such as glass particles is filled in the inner space inside the casing 22, followed by curing to complete the product.

EMBODIMENT 2

Figures 10, 11:
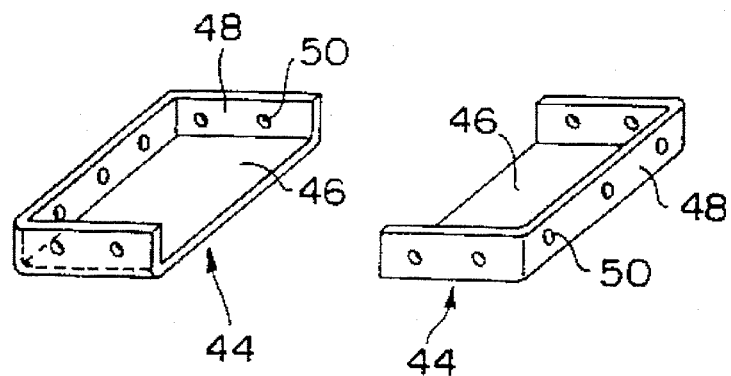
FIG. 10 is a perspective view showing the metal base used in the resin-sealed semiconductor device of the present invention shown in FIG. 8.
FIG. 11 is a perspective view showing the metal base used in the resin-sealed semiconductor device of the present invention shown in FIG. 8.

FIGS. 8 to 11 show an improvement to the embodiment described in EMBODIMENT 1. In this embodiment, a reinforcing means for reinforcing the engagement with the sealing resin is added. That is, in each assembly 42, a half split dish-like metal base 44 as shown in FIG. 10 or FIG. 11 is interposed between the semiconductor chip 28 and the insulator 24. In this embodiment, the metal base 44 also operates as a conductor layer. As shown in FIGS. 10 and 11, the metal base 44 has a bottom plate 46 and three side walls 48 erecting on the periphery of the bottom plate 46. The side walls 48 are formed of a plurality of through holes or anchoring holes 50 which are to be filled with the sealing resin, the anchoring holes preferably being distributed uniformly. The semiconductor chip 28 is welded to one surface of the metal base 44 and the metalized surface of the insulator 24 is welded to the opposite surface of he metal base 44. When the sealing resin 32 is filled in the space inside the casing 22, a part of the sealing resin 32 comes into the anchoring holes 50 provided in the side walls of the metal base 44 and is cured therein. As a result, the increase in bonding strength with the sealing resin due to the use of the resin film 40 and the anchoring effect due to the use of the anchoring holes 50 further increase the bonding strength between the heat sink 20 and the sealing resin 32 synergistically.

EMBODIMENT 3

Figure 12:
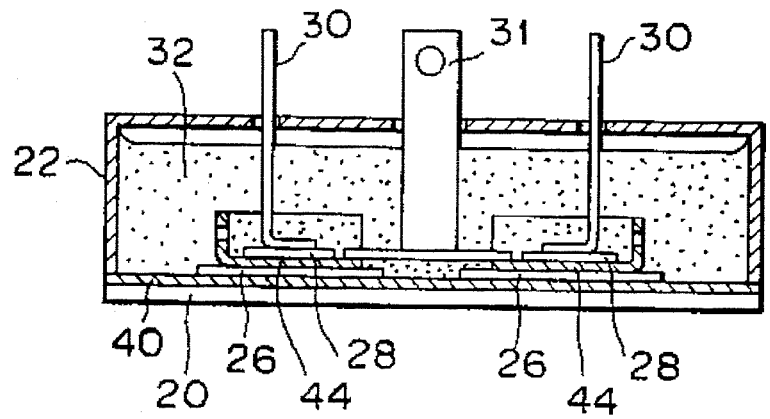
FIG. 12 is a vertical cross-sectional view showing a resin-sealed semiconductor device in accordance with Embodiment 3 of the present invention.
Figure 13:
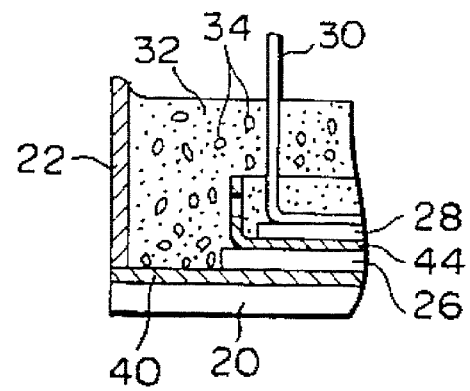
FIG. 13 is a partial enlarged view showing the resin-sealed semiconductor device shown in FIG. 12.
Figure 14:
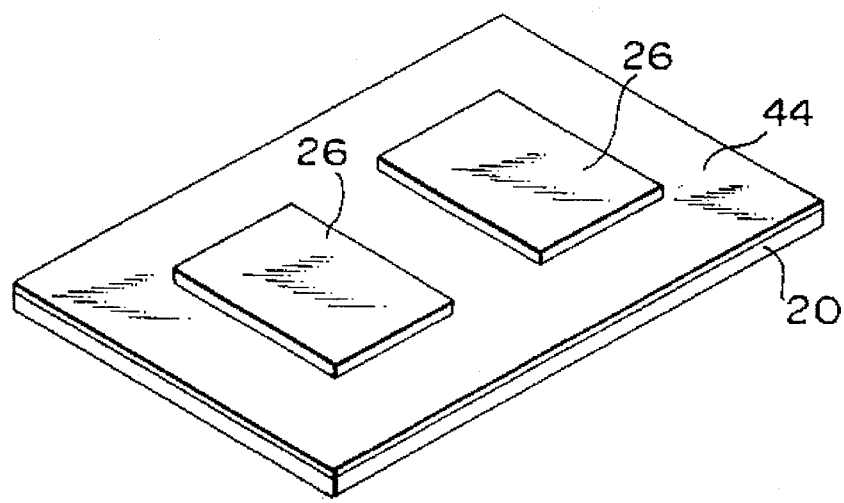
FIG. 14 is a perspective view showing a heat sink having provided thereon a metal base and two semiconductor chips adopted in the resin-sealed semiconductor device of the present invention shown in FIG. 12.

FIGS. 12 to 14 show a variation of the resin-sealed semiconductor device in accordance with EMBODIMENT 1 or 2. In this embodiment, the resin film 40 is provided all over the upper surface 21 of the heat sink 20, including the areas 36 where the semiconductor chips 28 are mounted as shown in FIG. 14. The resin film 40 also functions as an insulator, and the semiconductor chips 28 are mounted on the heat sink 20 via the half-split-dish-like metal base 44 as described in EMBODIMENT 2 and the conductor layer 26. This construction saves the insulator 24 used in EMBODIMENTS 1 and 2 to give a more simplified structure.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A resin-sealed semiconductor device, comprising:

a heat sink having an upper surface, said upper surface having an outer periphery;

an insulator provided on at least a part of said upper surface of said heat sink, said insulator having a predetermined thickness;

a semiconductor chip mounted above said insulator;

an output terminal connected to said semiconductor chip;

a casing connected to said outer periphery of said upper surface of said heat sink, said casing together with said heat sink defining a space and surrounding said semiconductor chip and a part of said output terminal, said space defined by said heat sink and said casing having a predetermined thickness;

a sealing resin which substantially fills said space defined by said heat sink and said casing to seal said semiconductor chip; and a film comprising an epoxy resin, said film having a thickness smaller than that of said space defined by said heat sink and said casing and smaller than that of said insulator, said film being provided on at least a portion of a remaining part of said upper surface of said heat sink, at least a part of said film contacting said sealing resin directly to thereby bond said sealing resin to said sink.

2. The resin-sealed semiconductor device as claimed in claim 1, wherein said film has a thickness of from 10 μm to 20 μm.

3. The resin-sealed semiconductor device as claimed in claim 1, wherein said film covers an area of said upper surface of said heat sink other than an area where said semiconductor chip is mounted.

4. The resin-sealed semiconductor device as claimed in claim 1, wherein said film covers said upper surface of said heat sink entirely, and further comprising a conductor layer, said semiconductor chip being provided on said conductor layer.

5. The resin-sealed semiconductor device as claimed in claim 1, wherein said sealing resin contains an aggregate.

6. The resin-sealed semiconductor device as claimed in claim 1, further comprising an anchoring member, a part of which is interposed between said heat sink and said semiconductor chip, with a remaining part of said anchoring member being embedded in said sealing resin.

7. The resin-sealed semiconductor device as claimed in claim 1, wherein said heat sink has a thermal expansion coefficient, said sealing resin has a thermal expansion coefficient, and said epoxy resin of said film has a thermal expansion coefficient which lies between the thermal expansion coefficients of said heat sink and said sealing resin.

8. A resin-filled semiconductor device, comprising:

a metal heat sink having an upper surface and having a thermal expansion coefficient;

a semiconductor chip;

support means for supporting the semiconductor chip on the heat sink above the upper surface thereof;

a casing having a hollow interior, the casing being mounted on the heat sink and covering the semiconductor chip;

at least one electrode which extends through the casing and which is electronically connected to the semiconductor chip;

sealing resin which substantially fills the interior of the casing, the sealing resin having a thermal expansion coefficient which is different from the thermal expansion coefficient of the heat sink; and bonding means for bonding the sealing resin to the upper surface of the heat sink, the bonding means comprising an epoxy resin film on the upper surface of the heat sink, the epoxy resin film having a thickness that does not exceed about 20 μm and having a thermal expansion coefficient that lies between the thermal expansion coefficients of the heat sink and the sealing resin.

9. The resin-sealed semiconductor device as claimed in claim 8, wherein the support means comprises an insulator which is disposed between the semiconductor chip and the upper surface of the heat sink, the insulator having a thickness which is greater than the thickness of the epoxy resin film.

10. The resin-sealed semiconductor device as claimed in claim 8, wherein the sealing resin comprises epoxy resin which contains an aggregate.

11. The resin-sealed semiconductor device as claimed in claim 8, wherein the support means comprises an anchoring member, a part of which is interposed between the heat sink and the semiconductor chip, with a remaining part of the anchoring member being embedded in the sealing resin.

12. The resin-sealed semiconductor device as claimed in claim 8, wherein the epoxy resin film has a portion which extends between the semiconductor chip and the heat sink, and wherein the support means includes said portion of the epoxy resin film.

* * * * *